(12) United States Patent
Niimura

(10) Patent No.: US 9,985,165 B2
(45) Date of Patent: May 29, 2018

(54) OPTICAL COUPLING DEVICE

(71) Applicant: Panasonic Intellectual Property Management Co., Ltd., Osaka (JP)

(72) Inventor: Yuichi Niimura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/314,502

(22) PCT Filed: Jul. 3, 2015

(86) PCT No.: PCT/JP2015/003351
§ 371 (c)(1),
(2) Date: Nov. 28, 2016

(87) PCT Pub. No.: WO2016/006215
PCT Pub. Date: Jan. 14, 2016

(65) Prior Publication Data
US 2017/0194528 A1    Jul. 6, 2017

(30) Foreign Application Priority Data
Jul. 7, 2014    (JP) .................................. 2014-139259

(51) Int. Cl.
*H01L 33/62*    (2010.01)
*H01L 31/167*    (2006.01)
(Continued)

(52) U.S. Cl.
CPC .......... *H01L 31/167* (2013.01); *H01L 25/167* (2013.01); *H01L 31/0203* (2013.01);
(Continued)

(58) Field of Classification Search
CPC .................................................. H01L 31/167
See application file for complete search history.

(56) References Cited

U.S. PATENT DOCUMENTS 6,588,946 B1 * 7/2003 Mitsui .................. H01L 25/167
250/239
6,630,623 B1 * 10/2003 Whitney ............... H01L 31/167
174/392

(Continued)

FOREIGN PATENT DOCUMENTS

| JP | 6-291356 | 10/1994 |
| JP | 2005-159137 | 6/2005 |
| JP | 2014-056935 | 3/2014 |

OTHER PUBLICATIONS

International Search Report of PCT application No. PCT/JP2015/003351 dated Sep. 15, 2015.

Primary Examiner — Eugene Lee
(74) Attorney, Agent, or Firm — McDermott Will & Emery LLP

(57) ABSTRACT

An optical coupling device includes a primary conductive plate, a light-emitting part, a secondary conductive plate, a light-receiving part, and a first conductive part. The light-emitting part is located on the primary conductive plate, converts an electrical signal to light, and emits the light. The secondary conductive plate is spaced apart from the primary conductive plate, and faces the light-emitting part. The light-receiving part is disposed on the secondary conductive plate to face the light-emitting part, and converts light from the light-emitting part to an electrical signal. The first conductive part is disposed at a side facing the light-emitting part, and has a point on which an electric field generated by a potential difference between the primary conductive plate and the secondary conductive plate is concentrated.

17 Claims, 13 Drawing Sheets

(51) Int. Cl.
  *H01L 25/16* (2006.01)
  *H01L 31/02* (2006.01)
  *H01L 31/0203* (2014.01)
  *H01L 33/48* (2010.01)

(52) U.S. Cl.
  CPC ...... *H01L 31/02005* (2013.01); *H01L 33/483* (2013.01); *H01L 33/62* (2013.01)

(56) References Cited

U.S. PATENT DOCUMENTS

| | | | | |
|---|---|---|---|---|
| 7,009,166 B2* | 3/2006 | Shoji | ............... | H01L 25/167 |
| | | | | 250/214 R |
| 7,170,099 B2* | 1/2007 | Noguchi | ............... | H01L 25/167 |
| | | | | 250/214.1 |
| 7,176,473 B2* | 2/2007 | Aki | ............... | H01L 23/552 |
| | | | | 250/551 |
| 9,236,954 B2* | 1/2016 | Mitamura | ............... | H04B 10/802 |
| 2005/0116145 A1 | 6/2005 | Aki et al. | | |
| 2014/0070120 A1 | 3/2014 | Mitamura et al. | | |
| 2015/0060892 A1* | 3/2015 | Noguchi | ............... | H01L 31/162 |
| | | | | 257/82 |

\* cited by examiner

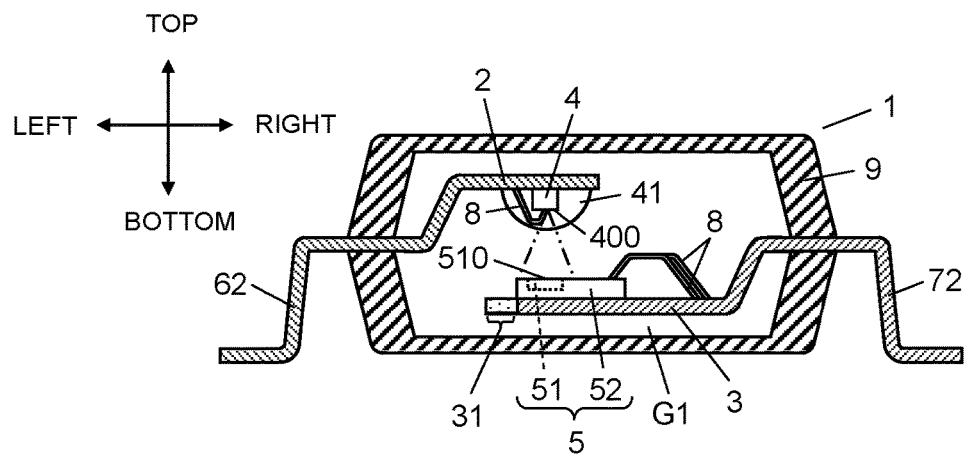
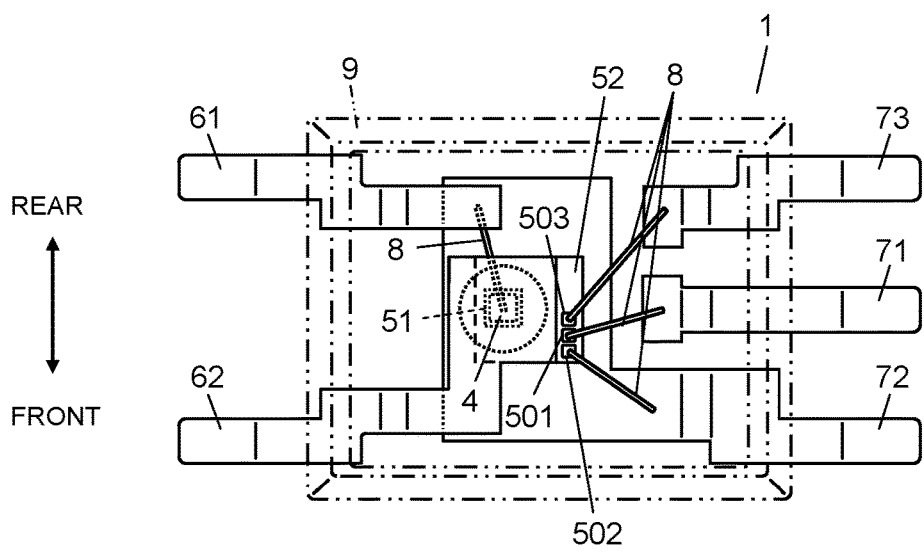

COMMON-MODE NOISE

OUTPUT

OUTPUT

FIG. 4A  PRIOR ART
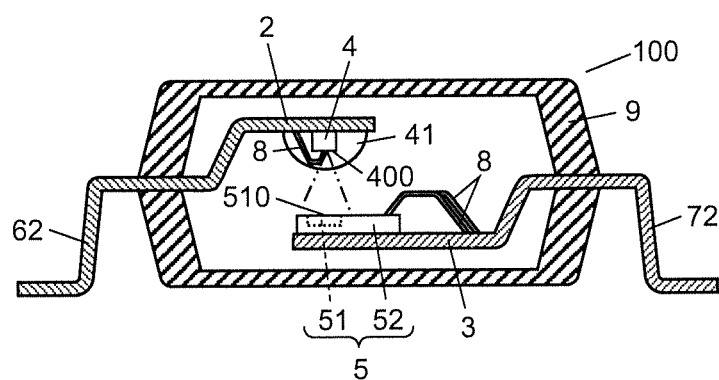
FIG. 4B  PRIOR ART
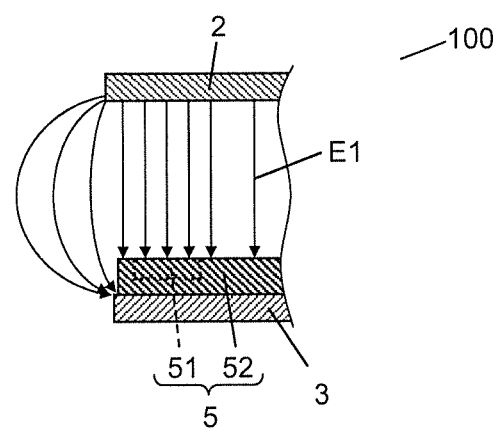

OPTICAL COUPLING DEVICE

CROSS-REFERENCE TO RELATED APPLICATIONS

This application is a U.S. national stage application of the PCT International Application No. PCT/JP2015/003351 filed on Jul. 3, 2015, which claims the benefit of foreign priority of Japanese patent application No. 2014-139259 filed on Jul. 7, 2014, the contents all of which are incorporated herein by reference.

TECHNICAL FIELD

The present disclosure relates to an optical coupling device, and more particularly to an optical coupling device including a light-emitting part and a light-receiving part.

BACKGROUND ART

A semiconductor device that operates using an optical signal as an input signal has been known to date. For example, a conventional semiconductor device includes a substrate, a light-receiving device (photodiode), an insulating layer, a light-transmitting conductive layer, and a light-shielding conductive layer. A light-receiving device is formed on the semiconductor substrate. The insulating layer is formed on the semiconductor substrate and covers the light-receiving device. The light-transmitting conductive layer is formed in the insulating layer on the light-receiving device. The light-shielding conductive layer is formed on the insulating layer so that an opening is formed above the light-receiving device.

An optical coupling device (photocoupler) using a combination of a light-receiving device and a light-emitting device of a semiconductor device is also proposed. In the optical coupling device, the light-emitting device converts an input electrical signal to light and emits the light. The light-receiving device receives light from the light-emitting device and converts the light to an electrical signal. In the optical coupling device, upon application of noise (common-mode noise) having a steep riding edge between the light-emitting device and the light-receiving device, a parasitic capacitance between the light-emitting device and the light-receiving device might cause a displacement current. In view of this, proposed is a technique for preventing malfunction by covering the light-receiving device with a light-transmitting conductive layer to shield a displacement current. As the prior-art technique described above, a technique described in Patent Literature 1 is known.

CITATION LIST

Patent Literature

PTL 1: Japanese Unexamined Patent Application Publication No. 6-291356

SUMMARY OF THE INVENTION

An optical coupling device includes a primary conductive plate, a light-emitting part, a secondary conductive plate, a light-receiving part, and a first conductive part. The light-emitting part is disposed on the primary conductive plate, converts an electrical signal to light, and emits the light. The secondary conductive plate is spaced apart from the primary conductive plate and disposed at a side facing the light-emitting part. The light-receiving part is disposed on the secondary conductive plate to face the light-emitting part, and converts light from the light-emitting part to an electrical signal. The first conductive part is disposed at a side facing the light-emitting part, and has a point on which an electric field generated by a potential difference between the primary conductive plate and the secondary conductive plate is concentrated.

BRIEF DESCRIPTION OF DRAWINGS

FIG. 1A is a cross-sectional view schematically illustrating an optical coupling device according to a first exemplary embodiment.

FIG. 1B is a top view schematically illustrating the optical coupling device according to the first exemplary embodiment.

FIG. 4A is a cross-sectional view schematically illustrating a conventional optical coupling device.

FIG. 4B illustrates distribution of electric lines of force of the conventional optical coupling device.

DESCRIPTION OF EMBODIMENTS

In a conventional optical coupling device, a light-receiving device is covered with a light-transmitting conductive layer. Thus, a process of covering the light-receiving device with the light-transmitting conductive layer is needed, leading to an increase in costs.

First Exemplary Embodiment

Figure 2:
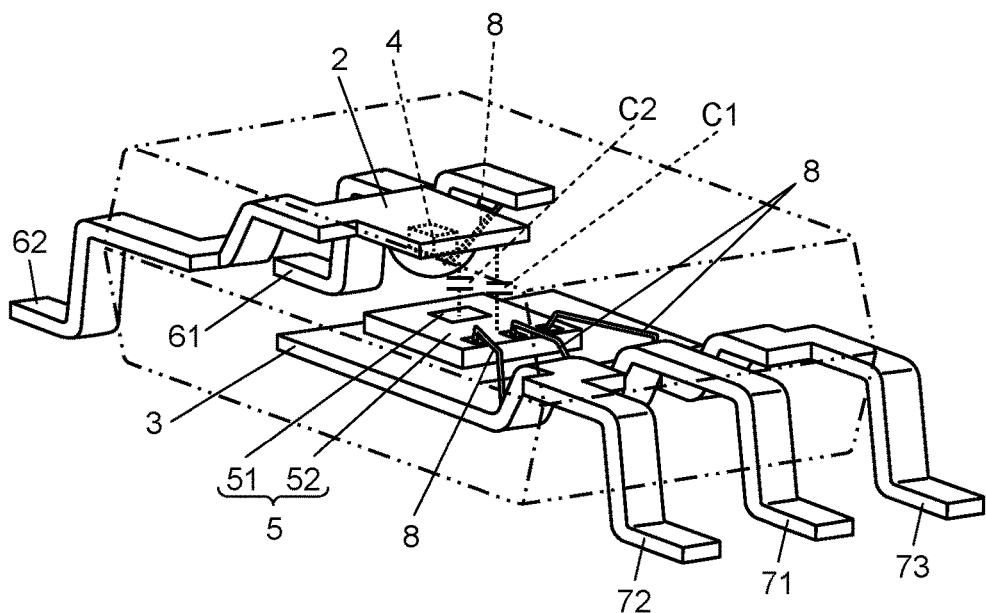
FIG. 2 is a perspective view schematically illustrating the optical coupling device according to the first exemplary embodiment.

FIG. 1A is a cross-sectional view schematically illustrating optical coupling device 1 according to a first exemplary embodiment. FIG. 1B is a top view schematically illustrating optical coupling device 1 according to the first exemplary embodiment. FIG. 2 is a perspective view schematically illustrating optical coupling device 1 according to the first exemplary embodiment.

Optical coupling device 1 includes primary conductive plate 2, light-emitting part 4, secondary conductive plate 3, light-receiving part 51, and first conductive part 31. Light-emitting part 4 converts an input electrical signal to light and emits the light. Light-receiving part 51 receives light from light-emitting part 4 and converts the light to an electrical signal. Light-emitting part 4 is attached to primary conductive plate 2. Secondary conductive plate 3 is spaced apart from primary conductive plate 2 and disposed at a side facing the light-emitting part. Light-receiving part 51 is attached to secondary conductive plate 3 so that light-receiving surface 510 of light-receiving part 51 faces light-emitting surface 400 of light-emitting part 4. First conductive part 31 is disposed at a side facing light-emitting part 4. First conductive part 31 is integrated with secondary conductive plate 3. First conductive part 31 has a point (concentrated point) on which an electric field generated by a potential difference between primary conductive plate 2 and secondary conductive plate 3 is concentrated. The concentrated point is located away from light-receiving part 51 of first conductive part 31. First conductive part 31 may be integrally formed with secondary conductive plate 3 or may be formed separately from secondary conductive plate 3.

Optical coupling device 1 according to the first exemplary embodiment will now be described. The configuration described below is merely an example of the invention. The invention is not limited to the exemplary embodiments below, and various modifications may be made depending on design or other factors without departing from the technical concept of the present invention. In the following description, the top, bottom, left, and right in FIG. 1A will be hereinafter referred to as the top, bottom, left, and right, respectively, and downward and upward in FIG. 1B will be hereinafter referred to as forward and rearward, respectively. However, this example is not intended to limit the application of optical coupling device 1.

As illustrated in FIGS. 1A and 1B, optical coupling device 1 includes primary conductive plate 2, secondary conductive plate 3, light-emitting part 4, an integrated circuit (IC) 5, and first conductive part 31. Optical coupling device 1 also includes first input terminal 61, second input terminal 62, first output terminal 71, second output terminal 72, third output terminal 73, and encapsulating member 9.

Each of primary conductive plate 2 and secondary conductive plate 3 is constituted by a die pad of a conductive lead frame. Primary conductive plate 2 and secondary conductive plate 3 are spaced apart from each other to face each other vertically. In the example of FIGS. 1A and 1B, primary conductive plate 2 and secondary conductive plate 3 are disposed in parallel in such a manner that primary conductive plate 2 is located above secondary conductive plate 3. Thus, the lower surface of primary conductive plate 2 and the upper surface of secondary conductive plate 3 face each other at a predetermined distance. The term "parallel" here includes not only a completely parallel arrangement but also a substantially parallel arrangement. The surface of primary conductive plate 2 facing secondary conductive plate 3 (i.e., the lower surface of primary conductive plate 2 in FIG. 1A) serves as an attachment surface to which light-emitting part 4 is attached. The surface of secondary conductive plate 3 facing primary conductive plate 2 (i.e., the upper surface of secondary conductive plate 3 in FIG. 1A) serves as an attachment surface to which IC 5 is attached.

Light-emitting part 4 is constituted by a light-emitting device that converts an input electrical signal to light. In the first exemplary embodiment, light-emitting part 4 is constituted by a light emitting diode (LED). In light-emitting part 4, a light-emitting layer (not shown) including an n-type semiconductor layer and a p-type semiconductor layer is formed on a light-transmitting substrate (not shown) having a light-transmitting property. Light generated by the light-emitting layer is emitted through the light-transmitting substrate. Light-emitting part 4 is attached to the attachment surface of primary conductive plate 2 with light-emitting surface 400 (lower surface in FIG. 1A) facing secondary conductive plate 3. Light-emitting part 4 is covered with a semispherical light-coupling part 41 of a resin material having a light-transmitting property.

Light-emitting part 4 is fixed to the attachment surface of primary conductive plate 2 with a conductive material such as a conductive paste. The conductive paste is, for example, an epoxy resin containing silver (Ag) powder. Thus, an n-type electrode (not shown) provided on the n-type semiconductor layer of light-emitting part 4 is electrically connected to primary conductive plate 2. A p-type electrode (not shown) provided on the p-type semiconductor layer of the light-emitting device is electrically connected to first input terminal 61 by bonding wire 8.

IC 5 is constituted by a photo IC. IC 5 is configured by integrating light-receiving part 51 and processing circuit 52 on one chip. Light-receiving part 51 converts light from light-emitting part 4 to an electrical signal. In the first exemplary embodiment, a photodiode is used as light-receiving part 51. Alternatively, light-receiving part 51 may be a phototransistor or a solar cell, for example. Light-receiving part 51 is formed by, for example, doping an n-type silicon substrate with a p-type impurity to form a p-type region.

IC 5 is attached to the attachment surface of secondary conductive plate 3 by using a coupling member (not shown) with light-receiving surface 510 (upper surface in FIG. 1A), which faces primary conductive plate 2, of light-receiving part 51. The coupling member only needs to fix light-receiving part 51 to the attachment surface of secondary conductive plate 3, and may be an electrically insulating material such as a synthetic resin (e.g., an epoxy resin or an acrylic resin) or a conductive material such as a conductive paste.

Processing circuit 52 is electrically connected to light-receiving part 51, and processes an electrical signal converted by light-receiving part 51. Processing circuit 52 includes, for example, an amplifier for amplifying the electrical signal converted by the light-receiving part 51. A first input point (not shown) of a pair of input points of processing circuit 52 is electrically connected to an anode of light-receiving part 51. A second input point (not shown) of the pair of input points of processing circuit 52 is electrically connected to a cathode of light-receiving part 51.

As illustrated in FIG. 1B, the upper surface of IC 5 is provided with first electrode 501, second electrode 502, and third electrode 503. First electrode 501 is electrically connected to a first output point (not shown) of a pair of output points of processing circuit 52. Second electrode 502 is electrically connected to a second output point (not shown) of the pair of output points of processing circuit 52. Third electrode 503 is electrically connected to a power supply terminal (not shown) of processing circuit 52. The upper surface of IC 5 is covered with a metal shielding member (not shown) except for light-receiving part 51, first electrode 501, second electrode 502, and third electrode 503.

Each of first input terminal 61 and second input terminal 62 is constituted by a lead of a conductive lead frame. Each of first input terminal 61 and second input terminal 62 is buried in encapsulating member 9 except for a longitudinal end (left end) thereof. In optical coupling device 1, the left ends of first input terminal 61 and second input terminal 62 project leftward from encapsulating member 9. An end (right end) of first input terminal 61 located inside encapsulating member 9 is electrically connected to an anode of light-emitting part 4 by bonding wire 8. An end (right end) of second input terminal 62 located inside encapsulating member 9 is integrated with primary conductive plate 2. Primary conductive plate 2 is electrically connected to a cathode of light-emitting part 4. That is, second input terminal 62 is electrically connected to the cathode of light-emitting part 4 through primary conductive plate 2.

Each of first output terminal 71, second output terminal 72, and third output terminal 73 is constituted by a lead of a conductive lead frame. Each of first output terminal 71, second output terminal 72, and third output terminal 73 are buried in encapsulating member 9 except for a longitudinal end (right end) thereof. In optical coupling device 1 of the first exemplary embodiment, the right ends of first output terminal 71, second output terminal 72, and third output terminal 73 project rightward from encapsulating member 9.

An end (left end) of first output terminal 71 located inside encapsulating member 9 is electrically connected to first electrode 501 by bonding wire 8. An end (left end) of second output terminal 72 located inside encapsulating member 9 is integrated with secondary conductive plate 3. Secondary conductive plate 3 (second output terminal 72) is electrically connected to second electrode 502 by bonding wire 8. Secondary conductive plate 3 (second output terminal 72) is also electrically connected to the ground (not shown) of the circuit. An end (left end) of third output terminal 73 located inside encapsulating member 9 is electrically connected to third electrode 503 by bonding wire 8. Third output terminal 73 is electrically connected to an external power supply (not shown) for supplying operating power to IC 5.

Encapsulating member 9 is a member for protecting light-emitting part 4 and light-receiving part 51 against external impact or light. Encapsulating member 9 is made of a resin material having an electrical insulating property and a light-shielding property. Examples of the resin material for encapsulating member 9 include an epoxy resin and a silicone resin each mixed with black pigment. In the first exemplary embodiment, encapsulating member 9 encapsulates primary conductive plate 2, secondary conductive plate 3, light-emitting part 4, IC 5, and first conductive part 31. Encapsulating member 9 also encapsulates parts of first input terminal 61, second input terminal 62, first output terminal 71, second output terminal 72, and third output terminal 73. Encapsulating member 9 only needs to encapsulate at least light-emitting part 4 and IC 5 (light-receiving part 51). The inside of encapsulating member 9 is filled with, for example, a resin material having an electrical insulating property and a light-transmitting property, such as a silicone resin.

In optical coupling device 1 of the first exemplary embodiment, light-emitting part 4 emits light in accordance with an electrical signal input between first input terminal 61 and second input terminal 62. Light-receiving part 51 receives light emitted from light-emitting part 4, and converts the light to an electrical signal in accordance with the received light to output the electrical signal to processing circuit 52. An output signal from processing circuit 52 is taken out through first output terminal 71 and second output terminal 72. That is, a voltage between first output terminal 71 and second output terminal 72 serves as a voltage of the output signal.

Here, primary conductive plate 2, secondary conductive plate 3, and the resin material filling the gap in encapsulating member 9 form a configuration similar to that of a capacitor as a whole. Thus, a parasitic capacitance occurs between primary conductive plate 2 and secondary conductive plate 3, especially between primary conductive plate 2 and IC 5. The parasitic capacitance can be generally divided into first parasitic capacitance C1 and second parasitic capacitance C2. As illustrated in FIG. 2, first parasitic capacitance C1 is a parasitic capacitance generated between primary conductive plate 2 and a part of IC 5 except light-receiving part 51. As illustrated in FIG. 2, second parasitic capacitance C2 is a parasitic capacitance generated between primary conductive plate 2 and light-receiving part 51.

Figure 3A:
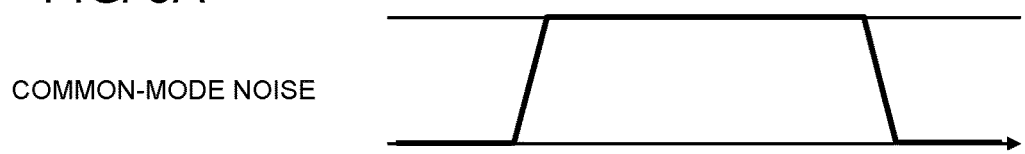
FIG. 3A is a waveform chart of common-mode noise of the optical coupling device according to the first exemplary embodiment.
Figure 3B:
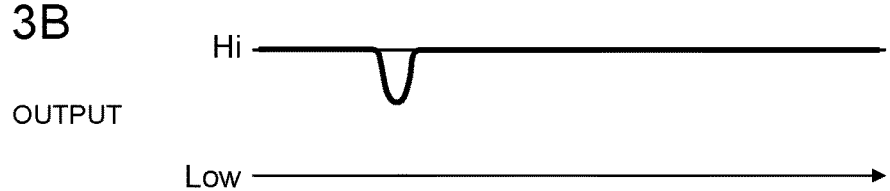
FIG. 3B is a waveform chart of an output signal under the influence of common-mode noise of the optical coupling device according to the first exemplary embodiment.
Figure 3C:
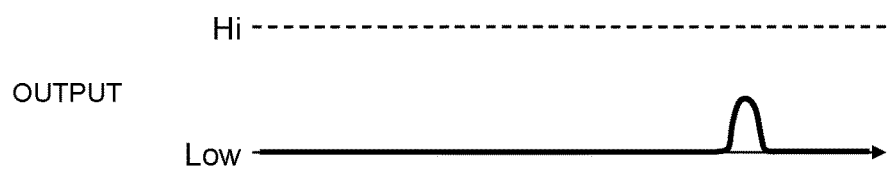
FIG. 3C is a waveform chart of an output signal under the influence of common-mode noise of the optical coupling device according to the first exemplary embodiment.

FIG. 3A is a waveform chart of common-mode noise of optical coupling device 1 according to the first exemplary embodiment. FIG. 3B is a waveform chart of an output signal under the influence of common-mode noise of optical coupling device 1 according to the first exemplary embodiment. FIG. 3C is a waveform chart of an output signal under the influence of common-mode noise of optical coupling device 1 according to the first exemplary embodiment. In optical coupling device of this type as well as optical coupling device 1 of the first exemplary embodiment, common-mode noise at a high frequency (so-called common-mode noise) can be input as disturbance in some cases. For example, suppose that pulsed common-mode noise as illustrated in FIG. 3A is input between second input terminal 62 (i.e., the cathode of light-emitting part 4) and the ground of IC 5. Then, a displacement current flowing through first parasitic capacitance C1 is guided to the ground of the circuit through the shielding member covering IC 5.

On the other hand, a displacement current flowing through second parasitic capacitance C2 is input to processing circuit 52 through light-receiving part 51 because light-receiving part 51 is not covered with the shielding member. Here, if the output signal is at a high level, when common-mode noise rises, the voltage of the output signal can transiently decrease as illustrated in FIG. 3B in some cases. If the output signal is at a low level, when common-mode noise falls, the voltage of the output signal can transiently rise as illustrated in FIG. 3C in some cases. In either case, common-mode noise causes variations of the output signal, which causes the possibility of malfunction of the optical coupling device.

In the conventional optical coupling device described in Patent Literature 1, the light-receiving device is covered with the light-transmitting conductive layer in order to solve the problems described above. In the conventional optical coupling device, however, the process of covering the light-receiving device with the light-transmitting conductive layer is needed, leading to an increase in costs. In addition, in the conventional optical coupling device, a parasitic capacitance additionally occurs between the light-transmitting conductive layer and the light-receiving device so that responsiveness might degrade. Furthermore, in the conventional optical coupling device, since the light-receiving device is covered with a mesh-like light-transmitting conductive layer, even if the light-transmitting conductive layer has a light-transmitting property, an effective light-receiving surface area of the light-receiving device is small, and thus, a signal to noise (SN) ratio decreases.

The transient voltage variation of the output signal caused by common-mode noise is proportional to the degree of the common-mode noise and a capacitance value of second parasitic capacitance C2. Thus, the transient voltage variation caused by common-mode noise can be reduced by reducing the capacitance value of second parasitic capacitance C2. Consequently, a common-mode transient rejection (CMTR) can be enhanced. This CMTR (unit: V/µs) is a parameter indicating a resistance of an optical coupling device to common-mode noise. As the CMTR increases, noise resistance of the optical coupling device increases.

In optical coupling device 1 of the first exemplary embodiment, first conductive part 31 is provided on an end portion of secondary conductive plate 3 in order to reduce the capacitance value of second parasitic capacitance C2. As illustrated in FIG. 1A, first conductive part 31 is integrated with secondary conductive plate 3, and projects from an end (left end) of secondary conductive plate 3 leftward (i.e., in the direction away from light-receiving part 51). Thus, the end (left end) of secondary conductive plate 3 opposite to second output terminal 72 faces the right end of first conductive part 31 and is connected thereto.

Figure 5:
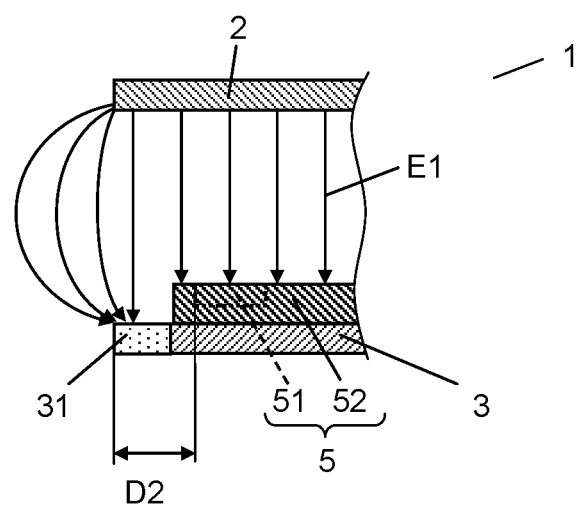
FIG. 5 illustrates distribution of electric lines of force of the optical coupling device according to the first exemplary embodiment.

FIG. 4A is a cross-sectional view schematically illustrating conventional optical coupling device 100. FIG. 4B illustrates distribution of electric lines of force of conventional optical coupling device 100. FIG. 5 illustrates distribution of electric lines of force of optical coupling device 1 according to the first exemplary embodiment. First, distribution of electric lines of force E1 between primary conductive plate 2 and secondary conductive plate 3 in the case of using conventional optical coupling device 100 (see FIG. 4A) including no first conductive part 31 will be described. When a potential difference (common-mode noise) occurs between primary conductive plate 2 and secondary conductive plate 3, electric lines of force E1 between primary conductive plate 2 and secondary conductive plate 3 are distributed as illustrated in FIG. 4B. As illustrated in FIG. 4B, electric lines of force E1 are concentrated between an end (left end) of primary conductive plate 2 and an end (left end) of secondary conductive plate 3. That is, the end (left end) of each of primary conductive plate 2 and secondary conductive plate 3 serves as a point on which electric lines of force E1 (electric field) are concentrated (concentrated point). In conventional optical coupling device 100, light-receiving part 51 is located near the concentrated point so that the density of electric lines of force E1 between primary conductive plate 2 and light-receiving part 51 is high. Thus, in conventional optical coupling device 100, second parasitic capacitance C2 increases, disadvantageously.

On the other hand, in optical coupling device 1 of the first exemplary embodiment, when a potential difference (common-mode noise) occurs between primary conductive plate 2 and secondary conductive plate 3, electric lines of force E1 between primary conductive plate 2 and secondary conductive plate 3 are distributed as illustrated in FIG. 5. As illustrated in FIG. 5, in optical coupling device 1, an end (left end) of first conductive part 31 is an end (left end) of secondary conductive plate 3, and thus, the concentrated point is separated from light-receiving part 51. That is, in optical coupling device 1 of the first exemplary embodiment, light-receiving part 51 is not located near the concentrated point. Thus, as compared to conventional optical coupling device 100, the density of electric lines of force E1 between primary conductive plate 2 and light-receiving part 51 is low. In this manner, optical coupling device 1 of the first exemplary embodiment has a lower density of electric lines of force E1 than conventional optical coupling device 100, and thus, can reduce the capacitance value of second parasitic capacitance C2. In FIG. 5, distance D2 from an end of first conductive part 31 to light-receiving part 51 is preferably 0.3 mm or more and 1.0 mm or less. That is, preferably, first conductive part 31 has a first surface (side surface) facing a side surface of secondary conductive plate 3 and a second surface at a side opposite to the first surface, and the second surface is at a distance of 0.3 mm or more and 1.0 mm or less from light-receiving part 51. More preferably, distance D2 from the end of first conductive part 31 to light-receiving part 51 is 0.5 mm or more and 1.0 mm or less. The density of electric lines of force E1 decreases by separating the end of first conductive part 31 from light-receiving part 51 as described above.

As described above, first conductive part 31 has a point (concentrated point) on which an electric field generated by a potential difference between primary conductive plate 2 and secondary conductive plate 3 is concentrated. The concentrated point is separated from light-receiving part 51. Thus, optical coupling device 1 of the first exemplary embodiment can prevent concentration of electric lines of force E1 between primary conductive plate 2 and light-receiving part 51. Accordingly, the capacitance value of second parasitic capacitance C2 can be reduced. As a result, optical coupling device 1 of the first exemplary embodiment can reduce a transient voltage variation caused by common-mode noise, thereby enhancing the CMTR. That is, unlike the conventional example of Patent Literature 1, optical coupling device 1 of the first exemplary embodiment eliminates the necessity of including a light-transmitting conductive layer, thereby increasing resistance to noise with reduced costs. Since optical coupling device 1 of the first exemplary embodiment does not need to include a light-transmitting conductive layer, decreases of responsiveness and a SN ratio are not likely to occur, unlike the conventional example.

In the above example of optical coupling device 1 of the first exemplary embodiment, first conductive part 31 is integrated with secondary conductive plate 3. The present invention, however, is not limited to this configuration. That is, first conductive part 31 may be formed separately from secondary conductive plate 3.

First Variation

Figure 6A:
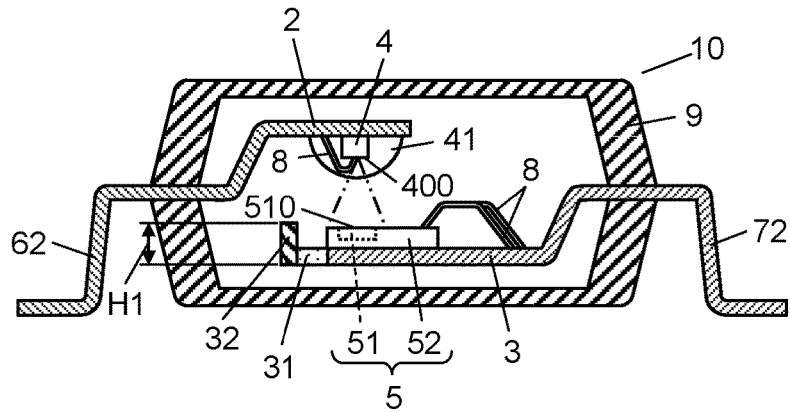
FIG. 6A is a cross-sectional view schematically illustrating another optical coupling device according to the first exemplary embodiment.
Figure 6B:
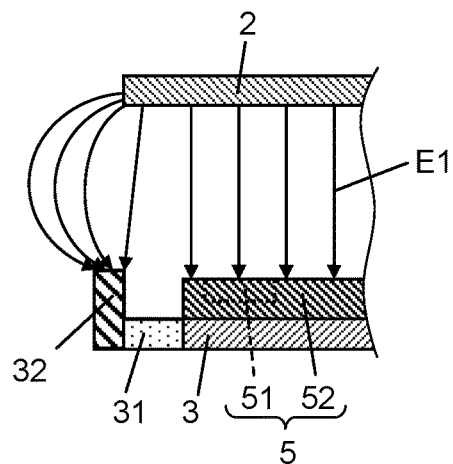
FIG. 6B illustrates distribution of electric lines of force of another optical coupling device according to the first exemplary embodiment.
Figure 6C:
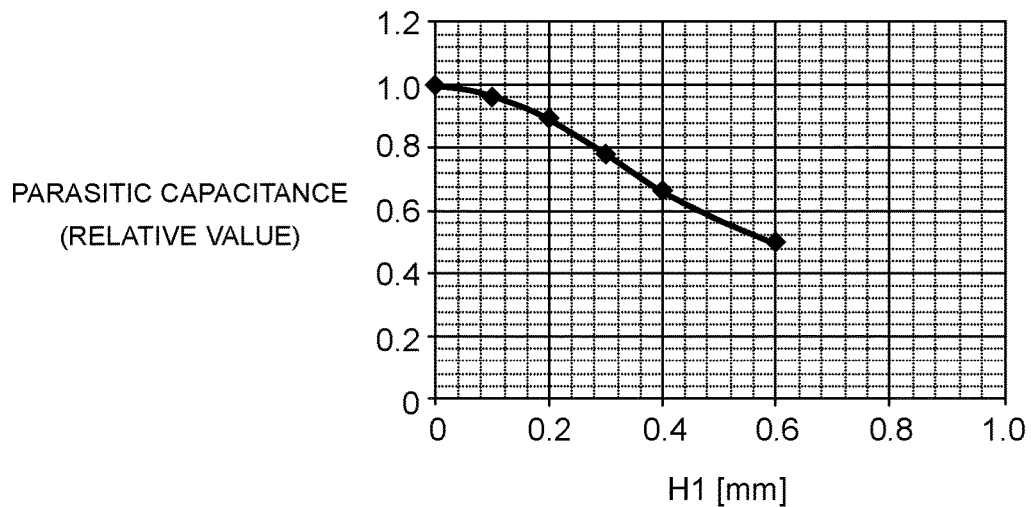
FIG. 6C shows a relation between the height of a second conductive part and a second parasitic capacitance in another optical coupling device according to the first exemplary embodiment.

Optical coupling device 10 according to a first variation of the first exemplary embodiment will now be described. FIG. 6A is a cross-sectional view schematically illustrating optical coupling device 10. FIG. 6B illustrates distribution of electric lines of force of optical coupling device 10. FIG. 6C shows a relation between height H1 of the second conductive part and second parasitic capacitance C2 in optical coupling device 10. As illustrated in FIG. 6A, in optical coupling device 10 of the first variation, first conductive part 31 includes second conductive part 32. Second conductive part 32 is integrated with secondary conductive plate 3 and first conductive part 31, and projects upward from an end (left end) of first conductive part 31. That is, first conductive part 31 includes second conductive part 32 that projects toward light-emitting part 4 (upward) from an end (left end) at a side away from light-emitting part 4.

In optical coupling device 10 of the first variation, when a potential difference (common-mode noise) occurs between primary conductive plate 2 and secondary conductive plate 3, electric lines of force E1 between primary conductive plate 2 and secondary conductive plate 3 are distributed as illustrated in FIG. 6B. As illustrated in FIG. 6B, in optical coupling device 10 of the first variation, an end (upper end) of second conductive part 32 serves as a concentrated point. Thus, in optical coupling device 10 of the first variation, the effect of preventing concentration of electric lines of force E1 on light-receiving part 51 can be further enhanced.

FIG. 6C illustrates a result of simulation in which height (a vertical dimension) H1 of second conductive part 32 is changed with a potential difference (common-mode noise) occurring between primary conductive plate 2 and secondary conductive plate 3. In FIG. 6C, the abscissa represents height H1 of second conductive part 32. In FIG. 6C, the ordinate represents a relative value of a capacitance value of second parasitic capacitance C2, where second parasitic capacitance C2 has a capacitance value of "1.0" in a case where height H1 of second conductive part 32 is 0 mm, that is, second conductive part 32 is not provided.

As illustrated in FIG. 6C, as height H1 of second conductive part 32 increases, the capacitance value of second parasitic capacitance C2 decreases. In this manner, as compared to the case of including only first conductive part 31, optical coupling device 10 of the first variation can reduce the capacitance value of second parasitic capacitance C2. Thus, optical coupling device 10 of the first variation can increase resistance to noise, as compared to the case of including only first conductive part 31.

In the example of optical coupling device 10 of the first variation, second conductive part 32 is integrated with secondary conductive plate 3 and first conductive part 31. The present invention, however, is not limited to this configuration. That is, second conductive part 32 may be formed separately from secondary conductive plate 3 and first conductive part 31.

Second Variation

Figure 7A:
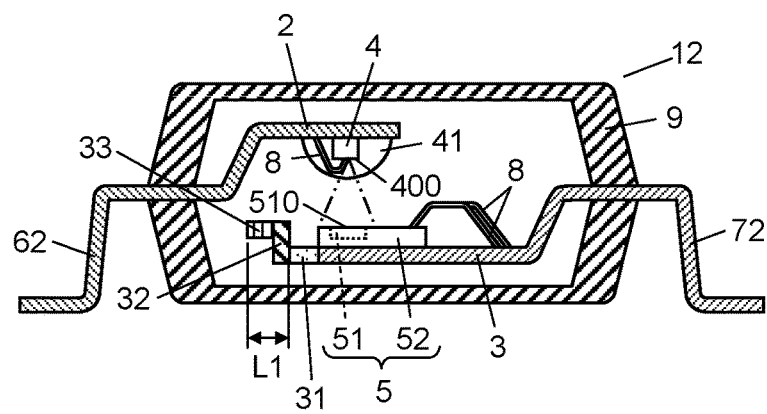
FIG. 7A is a cross-sectional view schematically illustrating another optical coupling device according to the first exemplary embodiment.
Figure 7B:
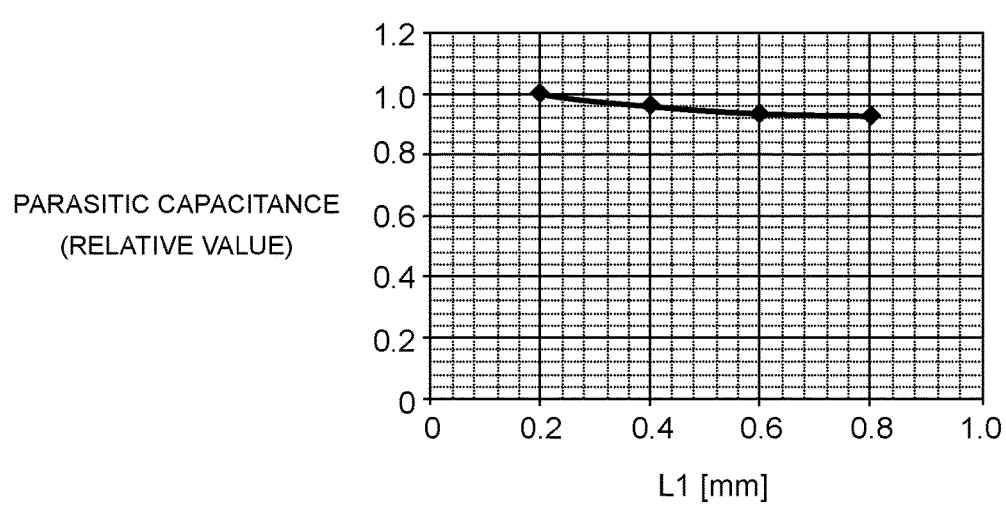
FIG. 7B shows a relation between the length of a third conductive part and a second parasitic capacitance in another optical coupling device according to the first exemplary embodiment.

Optical coupling device 12 according to a second variation of the first exemplary embodiment will now be described. FIG. 7A is a cross-sectional view schematically illustrating optical coupling device 12. FIG. 7B shows a relation between length L1 of the third conductive part and second parasitic capacitance C2 in optical coupling device 12. As illustrated in FIG. 7A, in optical coupling device 12 of the second variation, second conductive part 32 includes third conductive part 33. Third conductive part 33 is integrated with secondary conductive plate 3, first conductive part 31, and second conductive part 32. Third conductive part 33 projects leftward from an end (upper end) of second conductive part 32. That is, second conductive part 32 further includes third conductive part 33 projecting from an end (upper end) at a side close to light-emitting part 4 in a direction away from light-receiving part 51.

In optical coupling device 12 of the second variation, an end (left end) of third conductive part 33 serves as a concentrated point. In optical coupling device 12 of the second variation, the area subjected to electric lines of force E1 increases by an area corresponding to a surface (upper surface) of third conductive part 33. Thus, optical coupling device 12 of the second variation can enhance the effect of preventing concentration of electric lines of force E1 on light-receiving part 51, as compared to optical coupling device 12 of the first variation.

FIG. 7B illustrates a result of simulation in which length (a lateral dimension) L1 of third conductive part 33 is changed with a potential difference (common-mode noise) occurring between primary conductive plate 2 and secondary conductive plate 3. In FIG. 7B, the abscissa represents length L1 of third conductive part 33. In FIG. 7B, the ordinate represents a relative value of a capacitance value of second parasitic capacitance C2, where second parasitic capacitance C2 has a capacitance value of "1.0" in a case where length L1 of third conductive part 33 is 0.2 mm, that is, third conductive part 33 is not provided.

As illustrated in FIG. 7B, as length L1 of third conductive part 33 increases, the capacitance value of second parasitic capacitance C2 decreases. In this manner, as compared to the case of including only first conductive part 31 and second conductive part 32, optical coupling device 12 of the second variation can reduce the capacitance value of second parasitic capacitance C2. Thus, optical coupling device 12 of the second variation can increase resistance to noise, as compared to the case of including only first conductive part 31 and second conductive part 32.

Here, a surface (upper surface) of third conductive part 33 facing light-emitting part 4 is preferably closer to light-emitting part 4 than light-receiving surface 510 of light-receiving part 51 is. With this configuration, electric lines of force E1 are more easily concentrated on third conductive part 33 so that the density of electric lines of force E1 occurring between primary conductive plate 2 and light-receiving part 51 further decreases, and capacitance value of second parasitic capacitance C2 can be further reduced.

In the example of optical coupling device 12 of the second variation, third conductive part 33 is integrated with secondary conductive plate 3, first conductive part 31, and second conductive part 32. The present invention, however, is not limited to this configuration. That is, third conductive part 33 may be formed separately from secondary conductive plate 3, first conductive part 31, and second conductive part 32.

Second Exemplary Embodiment

Figure 8A:
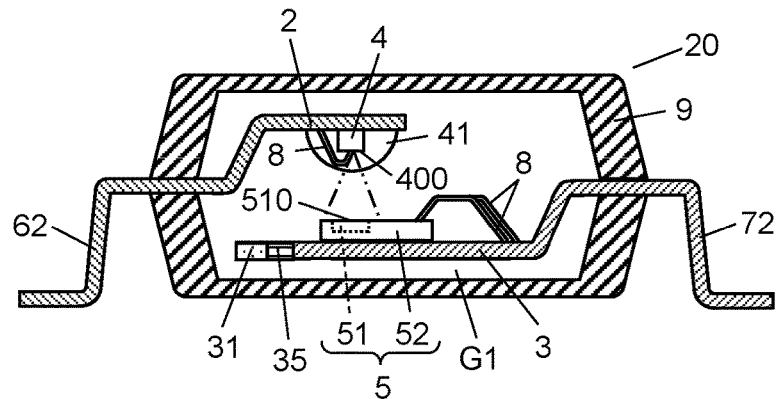
FIG. 8A is a cross-sectional view schematically illustrating an optical coupling device according to a second exemplary embodiment.
Figure 8B:
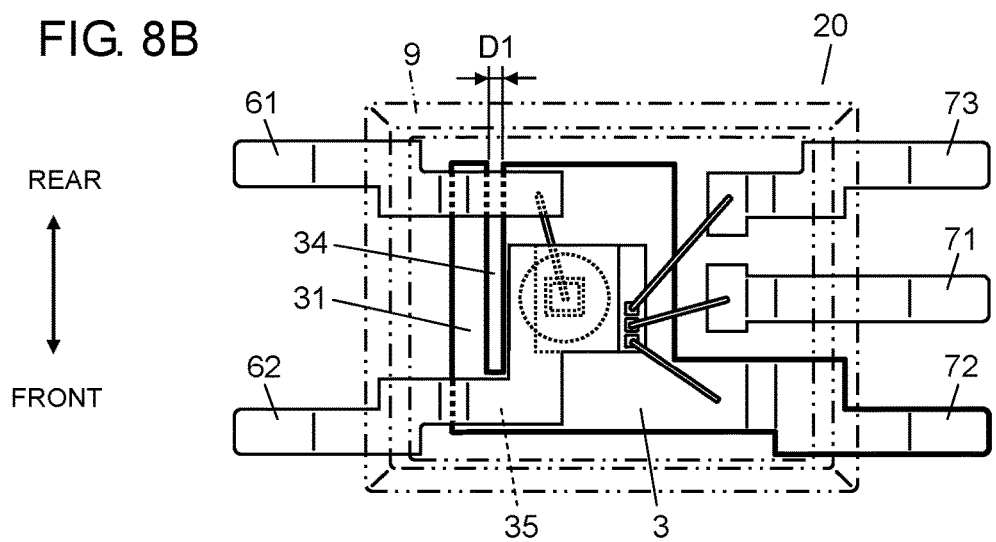
FIG. 8B is a top view schematically illustrating the optical coupling device according to the second exemplary embodiment.
Figure 8C:
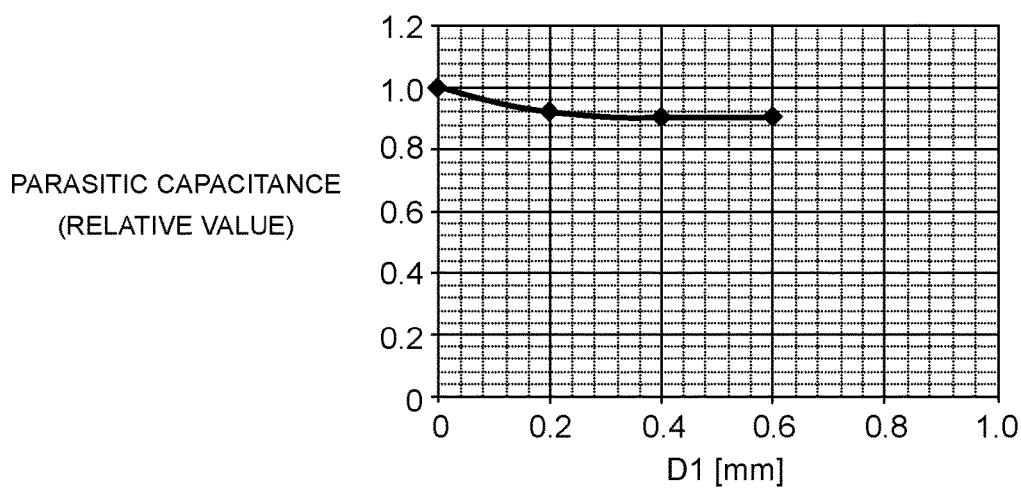
FIG. 8C shows a relation between a width of a gap and a second parasitic capacitance in the optical coupling device according to the second exemplary embodiment.

Optical coupling device 20 according to a second exemplary embodiment of the present invention will now be described. FIG. 8A is a cross-sectional view schematically illustrating optical coupling device 20 according to the second exemplary embodiment. FIG. 8B is a top view schematically illustrating optical coupling device 20 according to the second exemplary embodiment. FIG. 8C shows a relation between width D1 of a gap and second parasitic capacitance C2 in optical coupling device 20 according to the second exemplary embodiment. In optical coupling device 20 according to the second exemplary embodiment, description of components also included in optical coupling device 1 of the first exemplary embodiment will not be repeated, as appropriate. As illustrated in FIG. 8B, optical coupling device 20 of the second exemplary embodiment includes gap 34 between first conductive part 31 and secondary conductive plate 3. A front end (lower end in FIG. 8B) of first conductive part 31 is coupled to a front end (lower end in FIG. 8B) of secondary conductive plate 3. In the following description, these coupling ends will be hereinafter referred to as "coupling part 35." Gap 34 is formed between first conductive part 31 and secondary conductive plate 3 except for coupling part 35.

Width (a lateral dimension in FIG. 8B) D1 of gap 34 is such a dimension that prevents a periphery of gap 34 from serving as a concentrated point. That is, secondary conductive plate 3 and first conductive part 31 are configured to uniformly receive electric lines of force E1 in a plane (except ends thereof) including gap 34.

FIG. 8C illustrates a result of simulation in which width D1 of gap 34 is changed with a potential difference (common-mode noise) occurring between primary conductive plate 2 and secondary conductive plate 3. In FIG. 8C, the abscissa represents width D1 of gap 34. In FIG. 8C, the ordinate represents a relative value of a capacitance value of second parasitic capacitance C2, where second parasitic capacitance C2 has a capacitance value of "1.0" in a case where width D1 of gap 34 is 0 mm, that is, gap 34 is not provided.

As illustrated in FIG. 8C, as width D1 of gap 34 increases, the capacitance value of second parasitic capacitance C2 decreases. In this manner, as compared to the case of including only first conductive part 31, optical coupling device 20 of the second exemplary embodiment can reduce the capacitance value of the second parasitic capacitance. Thus, optical coupling device 20 of the second exemplary embodiment can increase resistance to noise, as compared to the case of including only first conductive part 31.

In optical coupling device 1 of the first exemplary embodiment, in filling the inside of encapsulating member 9 with a resin material, the resin material does not easily enter gap G1 (see FIG. 1A) between each of secondary conductive plate 3 and first conductive part 31, and the inner wall of encapsulating member 9, so that molding is not easy in some cases. On the other hand, in optical coupling device 20 of the second exemplary embodiment, gap 34 is formed between secondary conductive plate 3 and first conductive part 31. Thus, the resin material enters gap G1 through gap 34, so that there is an advantage that molding is easy.

Figure 9A:
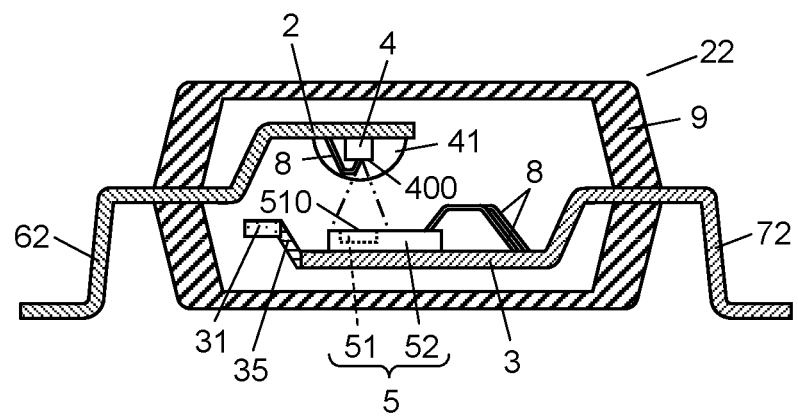
FIG. 9A is a cross-sectional view schematically illustrating another optical coupling device according to the second exemplary embodiment.
Figure 9B:
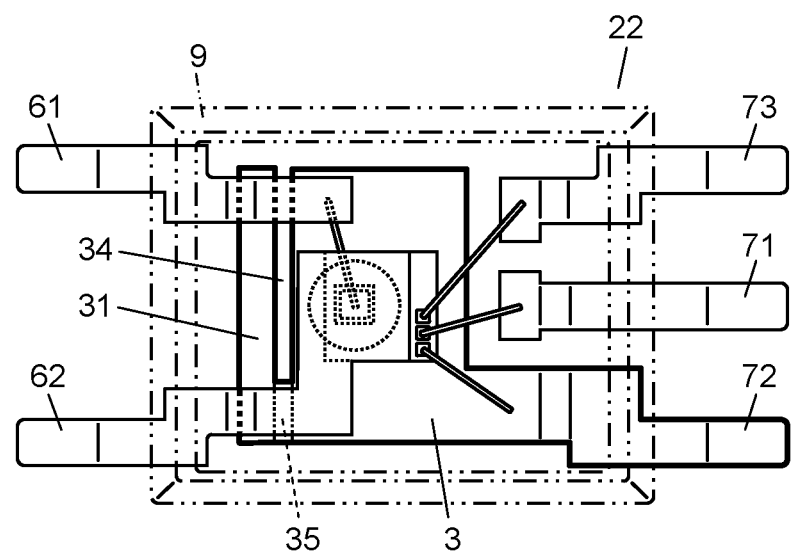
FIG. 9B is a top view schematically illustrating another optical coupling device according to the second exemplary embodiment.
Figure 10:
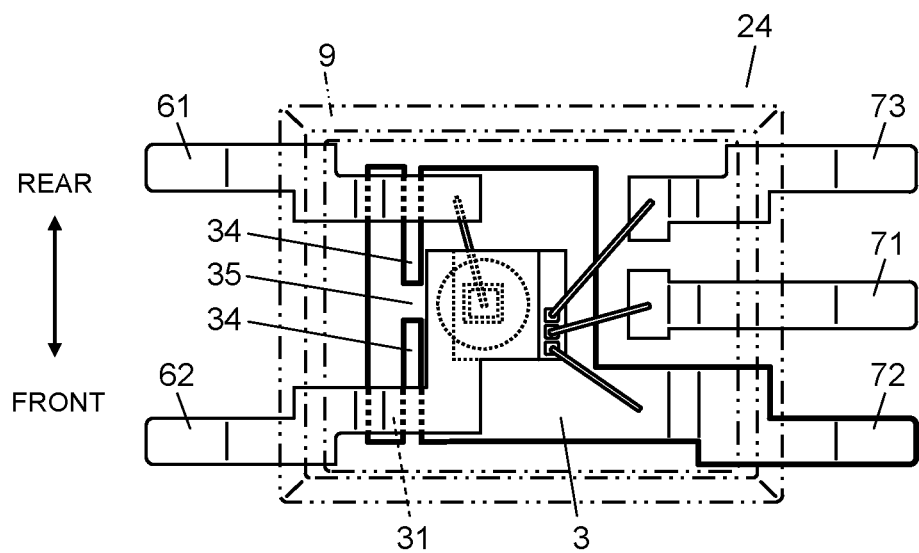
FIG. 10 is a top view schematically illustrating another optical coupling device according to the second exemplary embodiment.

FIG. 9A is a cross-sectional view schematically illustrating another optical coupling device 22 according to the second exemplary embodiment. FIG. 9B is a top view schematically illustrating optical coupling device 22 according to the second exemplary embodiment. FIG. 10 is a top view schematically illustrating another optical coupling device 24 according to the second exemplary embodiment. As illustrated in FIGS. 9A and 9B, a surface (upper surface) of first conductive part 31 facing light-emitting part 4 may be located closer to light-emitting part 4 than light-receiving surface 510 of light-receiving part 51 is. That is, first conductive part 31 may be located above secondary conductive plate 3. As illustrated in FIG. 10, coupling part 35 may connect center portions of first conductive part 31 and secondary conductive plate 3 in a front-rear direction.

In each of the above examples of optical coupling devices 20, 22, and 24, coupling part 35 is integrated with secondary conductive plate 3 and first conductive part 31. The present invention, however, is not limited to this configuration. That is, coupling part 35 may be formed separately from secondary conductive plate 3 and first conductive part 31.

First Variation

Figure 11A:
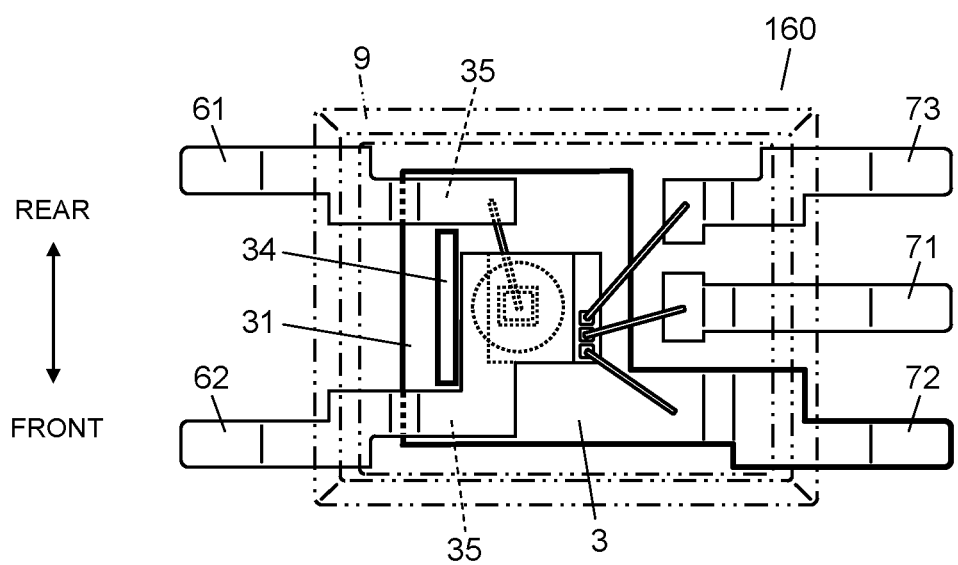
FIG. 11A is a top view schematically illustrating another optical coupling device according to the second exemplary embodiment.

Optical coupling device 160 according to a first variation of the second exemplary embodiment will now be described. FIG. 11A is a top view schematically illustrating optical coupling device 160. Optical coupling device 160 of the first variation includes a plurality of coupling parts 35. FIG. 11A illustrates optical coupling device 160 including two coupling parts 35. In optical coupling device 160 of the first variation, a front part and a rear part (upper and lower ends in FIG. 11A) of first conductive part 31 are respectively coupled to a front part and a rear part (upper and lower ends in FIG. 11A) of secondary conductive plate 3 by coupling parts 35. Gap 34 is formed between first conductive part 31 and secondary conductive plate 3 except for two coupling parts 35. Optical coupling device 160 of the first variation also has both advantages of increased resistance to noise and easiness of shaping.

Figure 11B:
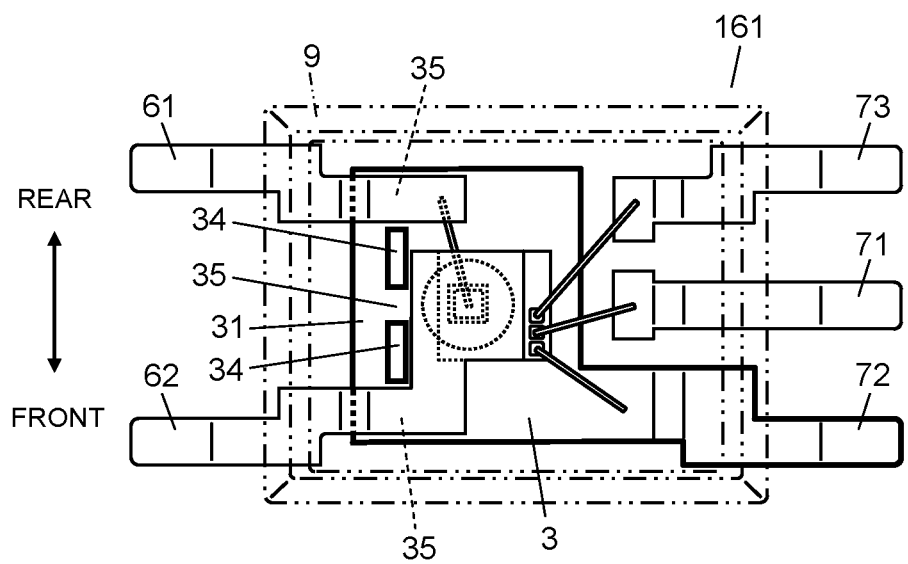
FIG. 11B is a top view schematically illustrating another optical coupling device according to the second exemplary embodiment.

The optical coupling device may include a larger number of coupling parts 35. FIG. 11B is a top view schematically illustrating optical coupling device 161. As illustrated in FIG. 11B, optical coupling device 161 according to the first variation includes three coupling parts 35. That is, in this configuration, a front part and a rear part (upper and lower ends in FIG. 11B) of first conductive part 31 are respectively coupled to a front part and a rear part (upper and lower ends in FIG. 11B) of secondary conductive plate 3 by coupling parts 35. Gap 34 is formed between first conductive part 31 and secondary conductive plate 3 except for three coupling parts 35. This configuration also has both increased resistance to noise and easiness of shaping.

Second Variation

Figure 12:
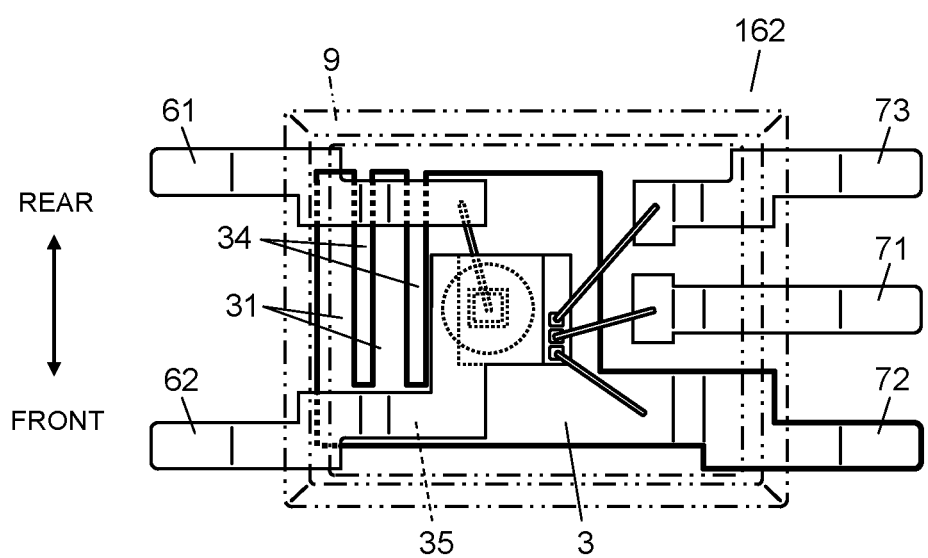
FIG. 12 is a top view schematically illustrating another optical coupling device according to the second exemplary embodiment.

Optical coupling device 162 according to a second variation of the second exemplary embodiment will now be described. FIG. 12 is a top view schematically illustrating optical coupling device 162. As illustrated in FIG. 12, optical coupling device 162 of the second variation includes a plurality of (two in FIG. 12) first conductive parts 31. Gap 34 is provided between first conductive part 31 adjacent to secondary conductive plate 3 and secondary conductive plate 3. Gap 34 is also provided between adjacent two first conductive parts 31. Front ends (lower ends in FIG. 10) of two first conductive parts 31 and secondary conductive plate 3 are coupled together by coupling part 35. Optical coupling device 162 of the second variation also has both advantages of increased resistance to noise and easiness of shaping.

Third Variation

Optical coupling device 163 according to a third variation of the second exemplary embodiment will now be described.

Figure 13A:
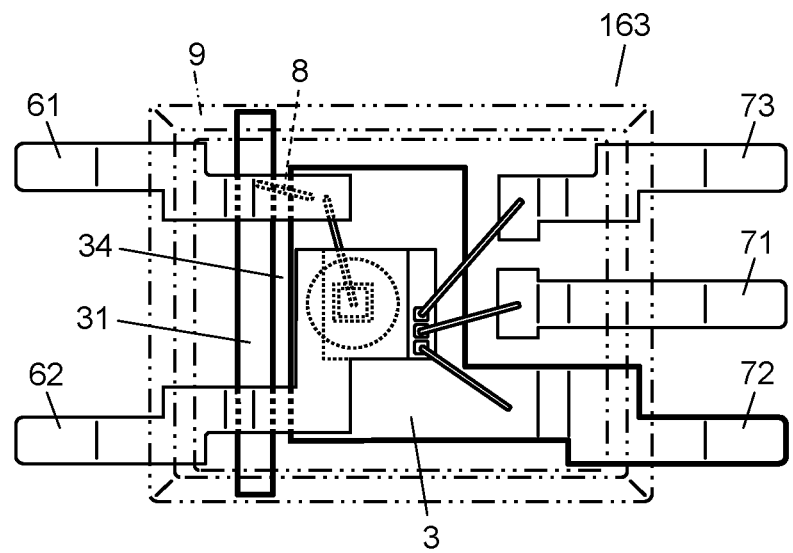
FIG. 13A is a top view schematically illustrating another optical coupling device according to the second exemplary embodiment.

FIG. 13A is a top view schematically illustrating optical coupling device 163. As illustrated in FIG. 13A, in optical coupling device 163 of the third variation, first conductive part 31 and secondary conductive plate 3 are separated from each other in a lateral direction. First conductive part 31 is electrically connected to secondary conductive plate 3 by bonding wire 8. Gap 34 is formed between first conductive part 31 and secondary conductive plate 3. Optical coupling device 163 of the third variation also has advantages of increased resistance to noise and easiness of shaping.

Figure 13B:
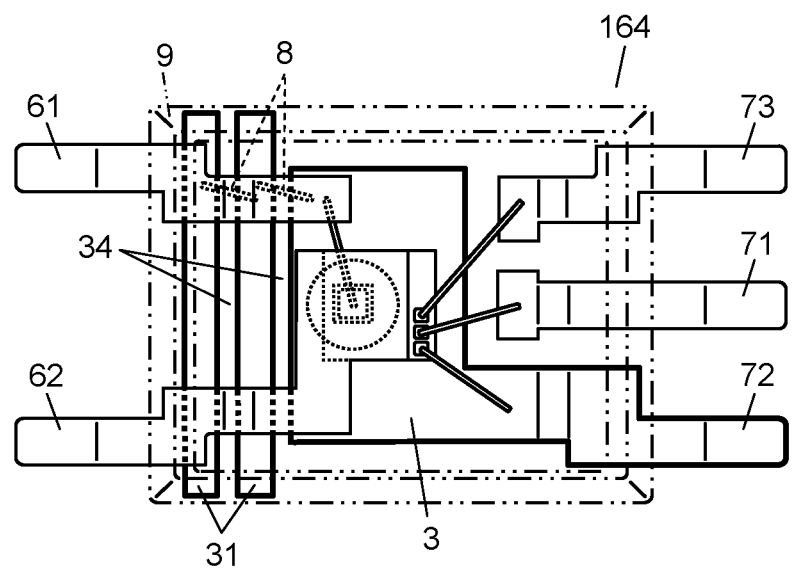
FIG. 13B is a top view schematically illustrating another optical coupling device according to the second exemplary embodiment.

A larger number of first conductive parts 31 may be provided. FIG. 13B is a top view schematically illustrating optical coupling device 164. As illustrated in FIG. 13B, optical coupling device 164 includes two first conductive parts 31. In this configuration, first conductive part 31 adjacent to secondary conductive plate 3 and secondary conductive plate 3 are separated from each other in the lateral direction. Two adjacent first conductive parts 31 are also separated from each other in the lateral direction. First conductive part 31 adjacent to secondary conductive plate 3 is electrically connected to secondary conductive plate 3 by bonding wire 8. Two adjacent first conductive parts 31 are also electrically connected to each other by bonding wire 8. Gap 34 is formed each of between first conductive part 31 adjacent to secondary conductive plate 3 and secondary conductive plate 3 and between two adjacent first conductive parts 31. This configuration also has both increased resistance to noise and easiness of shaping.

Fourth Variation

Figure 14:
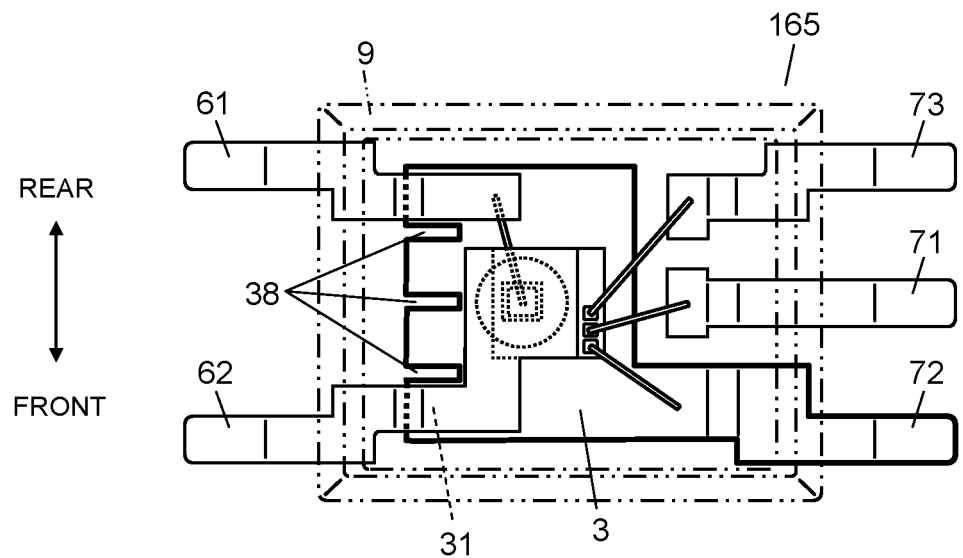
FIG. 14 is a top view schematically illustrating another optical coupling device according to the second exemplary embodiment.

Optical coupling device 165 according to a fourth variation of the second exemplary embodiment will now be described. FIG. 14 is a top view schematically illustrating optical coupling device 165. As illustrated in FIG. 14, in optical coupling device 165 of the fourth variation, first conductive part 31 includes three slits 38. That is, in first conductive part 31, three slits 38 are evenly spaced in a front-rear direction. In other words, a first surface (side surface) of first conductive part 31 faces a side surface of secondary conductive plate 3, and a second surface of first conductive part 31 opposite to the first surface includes slits 38. Slits 38 are formed by cutting out first conductive part 31, for example. Optical coupling device 165 of the fourth variation can also prevent concentration of electric lines of force between primary conductive plate 2 and light-receiving part 51. Thus, optical coupling device 165 has advantages of increased resistance to noise and easiness of shaping. In the fourth variation, three slits 38 are evenly spaced apart from one another. However, the number of slits 38 is not limited to three, and one or more slits 38 may be provided. Slits 38 do not need to be evenly spaced. However, slits 38 are preferably evenly spaced because electric lines of force can be uniformly distributed.

Fifth Variation

Figure 15:
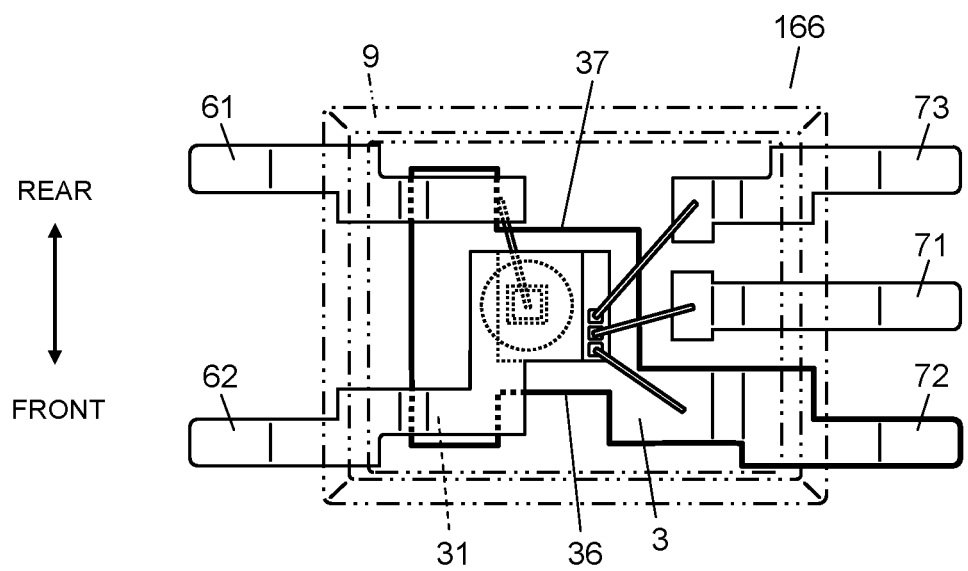
FIG. 15 is a top view schematically illustrating another optical coupling device according to the second exemplary embodiment.

Optical coupling device 166 according to a fifth variation of the second exemplary embodiment will now be described. FIG. 15 is a top view schematically illustrating optical coupling device 166. In optical coupling device 166 of the fifth variation, secondary conductive plate 3 includes one or a plurality of recesses 36 and/or steps 37. In the fifth variation, as illustrated in FIG. 15, secondary conductive plate 3 includes recess 36 and step 37. Recess 36 and step 37 are recessed inward from front and rear edges, respectively, of secondary conductive plate 3. In other words, a first surface (side surface) of secondary conductive plate 3 faces first conductive part 31, and recess 36 and/or step 37 is formed in at least a surface of secondary conductive plate 3 except the first surface. Recess 36 and step 37 are formed by cutting out secondary conductive plate 3, for example. Optical coupling device 166 of the fifth variation can also prevent concentration of electric lines of force between primary conductive plate 2 and light-receiving part 51. Thus, optical coupling device 166 has advantages of increased resistance to noise and easiness of shaping.

In optical coupling devices of the second exemplary embodiment including the variations thereof, first conductive part 31 is preferably electrically connected to a specific potential point. The specific potential point is, for example, a positive electrode of an external power supply (not shown) or the ground of the circuit. The specific potential point preferably has a potential equal to a potential of a potential point to which secondary conductive plate 3 is electrically connected.

In the optical coupling device of the second exemplary embodiment, secondary conductive plate 3 is electrically connected to the ground of the circuit (not shown) through second output terminal 72. In the optical coupling device of the second exemplary embodiment, first conductive part 31 is electrically connected to secondary conductive plate 3 by bonding wire 8 or coupling part 35. Thus, first conductive part 31 is electrically connected to the ground potential of the circuit.

Although optical coupling device of the second exemplary embodiment includes processing circuit 52 and encapsulating member 9 in addition to light-emitting part 4, light-receiving part 51, primary conductive plate 2, secondary conductive plate 3, and first conductive part 31, the optical coupling device of the second exemplary embodiment only needs to include at least light-emitting part 4, light-receiving part 51, primary conductive plate 2, secondary conductive plate 3, and first conductive part 31.

An optical coupling device according to the present disclosure includes a first conductive part including a concentrated point of an electric field generated by a potential difference (common-mode noise) between primary conductive plate 2 and secondary conductive plate 3. The first conductive part has a concentrated point located away from a light-receiving part. Thus, it is possible to prevent concentration of electric lines of force between the primary conductive plate and the light-receiving part so that a parasitic capacitance between the primary conductive plate and the light-receiving part can be reduced. As a result, a transient voltage variation due to common-mode noise decreases so that the CMTR is enhanced. Thus, unlike a conventional technique, a light-transmitting conductive layer is not needed so that resistance to noise can be enhanced with suppressed increase in costs.

The invention claimed is:

1. An optical coupling device comprising:
   a primary conductive plate;
   a light-emitting part that is disposed on a surface of the primary conductive plate, converts an electrical signal to light, and emits the light;
   a secondary conductive plate spaced apart from the surface of the primary conductive plate to face the surface of the primary conductive plate and disposed at a side facing the light-emitting part;
   a light-receiving part that is disposed on the secondary conductive plate to face the light-emitting part, and converts the light from the light-emitting part to an electrical signal; and
   a first conductive part disposed at the secondary conductive plate, the first conductive part facing the light-emitting part, wherein an electric field generated by a potential difference between the primary conductive plate and the secondary conductive plate is concentrated to the first conductive part, and the primary conductive plate has a first end and a second end opposite to the first end with respect to the light-emitting element disposed on the surface of the primary conductive plate, the first end of the primary conductive plate is closer to the first conductive part than the second end of the primary conductive plate, and a width of the first end of the primary conductive plate is larger than a width of the second end of the primary conductive plate.

2. The optical coupling device of claim 1, wherein the secondary conductive plate and the first conductive part are integrated.

3. The optical coupling device of claim 1, wherein
the first conductive part has a first surface that faces the secondary conductive plate,
the first conductive part has a second surface at a side opposite to the first surface, and
the second surface is at a distance of 0.3 mm or more and 1.0 mm or less from the light-receiving part.

4. The optical coupling device of claim 1, further including a second conductive part projecting toward the light-emitting part from an end of first conductive part separated from the light-receiving part.

5. The optical coupling device of claim 4, further including a third conductive part projecting from an end of the second conductive part near the light-emitting part in a direction away from the light-receiving part.

6. The optical coupling device of claim 5, wherein a surface of the third conductive part facing the light-emitting part is closer to the light-emitting part than a light-receiving surface of the light-receiving part is.

7. The optical coupling device of claim 1, wherein a gap is provided between the secondary conductive plate and the first conductive part.

8. The optical coupling device of claim 7, further comprising a coupling part coupling the secondary conductive plate and the first conductive part.

9. The optical coupling device of claim 8, wherein a surface of the first conductive part facing the light-emitting part is closer to the light-emitting part than a light-receiving surface of the light-receiving part is.

10. The optical coupling device of claim 7, further comprising a bonding wire coupling the secondary conductive plate and the first conductive part.

11. The optical coupling device of claim 1, wherein
the first conductive part has a first surface facing the secondary conductive plate, and has a second surface at a side opposite to the first surface, and
the second surface has a slit.

12. The optical coupling device of claim 1, wherein
the secondary conductive plate has a first surface facing the first conductive plate, and
at least a surface of the secondary conductive plate except the first surface includes a recess.

13. The optical coupling device of claim 1, wherein the first conductive part is electrically connected to a specific potential point.

14. The optical coupling device of claim 13, wherein the specific potential point has a potential equal to a potential of a potential point to which the secondary conductive plate is electrically connected.

15. The optical coupling device of claim 1, further comprising:
a processing circuit that is electrically connected to the light-receiving part and processes an electrical signal output from the light-receiving part; and
an encapsulating member encapsulating the light-emitting part and the light-receiving part.

16. The optical coupling device of claim 1, further comprising:
an input terminal electrically connected to the light-emitting part, the input terminal being connected to the first end of the primary conductive plate; and
an output terminal electrically connected to the light-receiving part, the output terminal being connected to the secondary conductive plate, wherein
the output terminal extends from the secondary conductive plate in a direction from the first end of the primary conductive plate to the second end of the primary conductive plate.

17. The optical coupling device of claim 1, further comprising:
a light-coupling part provided on the surface of the primary conductive plate, the light-coupling part being made of a resin material having a light-transmitting property and covering the light-emitting part, wherein
the light-emitting part is apart from the first conductive part, the secondary conductive plate, and the light-receiving part via a gap, and
the light-emitting part overlaps the first conductive part viewed in a direction in which the secondary conductive plate faces the primary conductive plate.

* * * * *